US011088092B2

(12) United States Patent
Sio et al.

(10) Patent No.: US 11,088,092 B2
(45) Date of Patent: Aug. 10, 2021

(54) VIA RAIL SOLUTION FOR HIGH POWER ELECTROMIGRATION

(71) Applicant: Taiwan Semiconductor Manufacturing Co., Ltd., Hsin-Chu (TW)

(72) Inventors: Kam-Tou Sio, Zhubei (TW); Chih-Ming Lai, Hsinchu (TW); Chun-Kuang Chen, Guanxi Township (TW); Chih-Liang Chen, Hsinchu (TW); Charles Chew-Yuen Young, Cupertino, CA (US); Chi-Yeh Yu, Hsinchu (TW); Jiann-Tyng Tzeng, Hsin Chu (TW); Ru-Gun Liu, Zhubei (TW); Wen-Hao Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 148 days.

(21) Appl. No.: 16/106,395

(22) Filed: Aug. 21, 2018

(65) Prior Publication Data

US 2018/0358309 A1  Dec. 13, 2018

Related U.S. Application Data

(62) Division of application No. 15/213,506, filed on Jul. 19, 2016, now Pat. No. 10,510,688.
(Continued)

(51) Int. Cl.
*H01L 23/528* (2006.01)
*H01L 23/522* (2006.01)
(Continued)

(52) U.S. Cl.
CPC .......... *H01L 23/564* (2013.01); *H01L 23/485* (2013.01); *H01L 23/522* (2013.01);
(Continued)

(58) Field of Classification Search
CPC ......... H01L 21/76804; H01L 21/76816; H01L 23/528; H01L 23/5283; H01L 23/5286;
(Continued)

(56) References Cited

U.S. PATENT DOCUMENTS 6,417,572 B1 * 7/2002 Chidambarrao ...... H01L 23/528
257/773
2002/0113271 A1 * 8/2002 Noguchi ........... H01L 21/02063
257/369
(Continued)

OTHER PUBLICATIONS

Non-Final Office Action dated Oct. 4, 2018 for U.S. Appl. No. 15/213,506.
(Continued)

*Primary Examiner* — Monica D Harrison
*Assistant Examiner* — John Lin
(74) *Attorney, Agent, or Firm* — Eschweiler & Potashnik, LLC

(57) ABSTRACT

The present disclosure relates to a method of forming an integrated chip. The method may be performed by forming first and second source regions within a substrate. The first and second source regions are separated by a drain region along a first direction. First and second middle-end-of-the-line (MEOL) structures are formed over the substrate. The first and second MEOL structures have bottom surfaces that continually extend past edges of the first and second source regions, respectively, along a second direction perpendicular to the first direction. A power rail is formed that is electrically coupled to the first and second MEOL structures. The power rail has a first interconnect wire, a via rail on and in contact with the first interconnect wire, and a second inter-
(Continued)

connect wire on and in contact with the via rail. The via rail continuously extends along the first direction past the first and second MEOL structures.

20 Claims, 10 Drawing Sheets

Related U.S. Application Data

(60) Provisional application No. 62/246,366, filed on Oct. 26, 2015.

(51) Int. Cl.
*H01L 23/00* (2006.01)
*H01L 23/485* (2006.01)
*H01L 21/8234* (2006.01)
*H01L 23/532* (2006.01)

(52) U.S. Cl.
CPC ........ *H01L 23/528* (2013.01); *H01L 23/5226* (2013.01); *H01L 23/5283* (2013.01); *H01L 23/5286* (2013.01); *H01L 21/823475* (2013.01); *H01L 23/53223* (2013.01); *H01L 23/53238* (2013.01); *H01L 23/53266* (2013.01); *H01L 23/53295* (2013.01)

(58) Field of Classification Search
CPC ....... H01L 23/48; H01L 23/481; H01L 23/52; H01L 23/522; H01L 23/535; H01L 23/5226; H01L 23/53295; H01L 21/768; H01L 21/76838; H01L 21/76895; H01L 23/53223; H01L 23/53238; H01L 23/53266; H01L 23/485; H01L 23/564; H01L 21/823475
See application file for complete search history.

(56) References Cited

U.S. PATENT DOCUMENTS

| | | | |
|---|---|---|---|
| 2006/0138565 A1 | 6/2006 | Su | |
| 2006/0194430 A1* | 8/2006 | Beck | H01L 21/76844 |
| | | | 438/627 |
| 2006/0289994 A1* | 12/2006 | Greenberg | H01L 23/528 |
| | | | 257/758 |
| 2006/0289999 A1 | 12/2006 | Lee et al. | |
| 2007/0158783 A1 | 7/2007 | Chen et al. | |
| 2007/0205515 A1 | 9/2007 | Agarwala et al. | |
| 2007/0295996 A1* | 12/2007 | Mallikararjunaswamy | |
| | | | H01L 29/41758 |
| | | | 257/204 |
| 2009/0218691 A1 | 9/2009 | Yang et al. | |
| 2009/0294973 A1 | 12/2009 | Chanda et al. | |
| 2010/0065921 A1* | 3/2010 | Chuang | H01L 21/76895 |
| | | | 257/383 |
| 2010/0117190 A1 | 5/2010 | Chuang et al. | |
| 2011/0121460 A1 | 5/2011 | Watanabe et al. | |
| 2011/0147061 A1 | 6/2011 | Leung et al. | |
| 2012/0280287 A1 | 11/2012 | Hou et al. | |
| 2014/0197499 A1* | 7/2014 | Chen | H01L 27/088 |
| | | | 257/410 |
| 2014/0252644 A1 | 9/2014 | O'Brien et al. | |
| 2016/0079175 A1 | 3/2016 | Zhu et al. | |

OTHER PUBLICATIONS

Non-Final Office Action dated Aug. 25, 2017 for U.S. Appl. No. 15/213,506.

Non-Final Office Action dated Feb. 26, 2018 for U.S. Appl. No. 15/213,506.

Non-Final Office Action dated Apr. 19, 2019 in connection with related U.S. Appl. No. 15/213,506.

* cited by examiner

US 11,088,092 B2

VIA RAIL SOLUTION FOR HIGH POWER ELECTROMIGRATION

REFERENCE TO RELATED APPLICATIONS

This Application is a Divisional of U.S. application Ser. No. 15/213,506 filed on Jul. 19, 2016, which claims priority to U.S. Provisional Application No. 62/246,366 filed on Oct. 26, 2015. The contents of the above-referenced Applications are hereby incorporated by reference in their entirety.

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
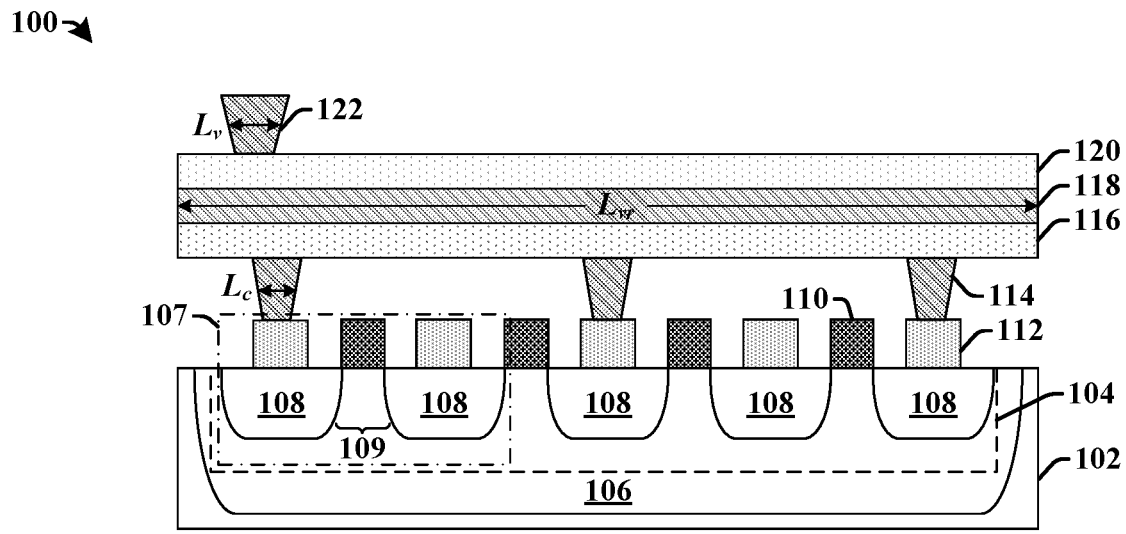
FIG. 1 illustrates a cross-sectional view of some embodiments of an integrated circuit having a back-end-of-the-line (BEOL) metal stack comprising a via rail configured to mitigate electro-migration.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips (ICs) comprise power distribution networks that are configured to distribute power and ground voltages to multiple devices (e.g., transistors) within the ICs. Power distribution networks often comprise power rails, which are metal interconnect wires arranged within a back-end-of-the-line (BEOL) metal stack. The power rails are held at a selected voltage potential and are electrically coupled to a plurality of devices, so as to provide the voltage potential to the devices. For example, integrated chips often comprise a first power rail held at a source voltage potential ($V_{SS}$) and a second power rail held at a ground voltage potential ($V_{DD}$).

Typically, power rails are arranged on a lower metal interconnect wire (e.g., a "M1" layer). However, as the size of integrated chips decreases the size of the power rails has also decreased, causing a high current density within the power rails. It has been appreciated that in emerging technology nodes (e.g., 14 nm, 10 nm, 7 nm, 5 nm, etc.) the high current density can lead to reliability concerns such as electro-migration and/or IR issues (due to a higher resistance of the smaller metal interconnect wires). To improve electro-migration larger power rails (e.g., having a larger width and/or the height) may be used, however such an approach prevents proper scaling of cell sizes. Alternatively, multiple stacked metal interconnect wire layers may be collectively operated to act as a power rail structure. However, such an approach cannot prevent electro-migration 'hot spots' (i.e., areas within one or more of the multiple metal interconnect wire layers experiencing high electro-migration).

The present disclosure relates to an integrated circuit having a power rail structure, comprising two metal wire layers and an intervening via rail, which enables proper cell scaling while preventing reliability concerns such as electro-migration and/or IR issues. In some embodiments, the integrated circuit comprises a first plurality of conductive contacts arranged over a semiconductor substrate. A first metal interconnect wire is arranged over the first plurality of conductive contacts, and a second metal interconnect wire arranged over the first metal interconnect wire. A via rail is arranged over the first metal interconnect wire and is configured to electrically couple the first metal interconnect wire and the second metal interconnect wire. The via rail has a length that continuously extends over two or more of the plurality of conductive contacts. The length of the via rail provides for an increased cross-sectional area both between the first metal interconnect wire and the second metal interconnect wire and along a length of the via rail, thereby mitigating electro-migration and electro-migration hot spots within the integrated circuit.

FIG. 1 illustrates a cross-sectional view of some embodiments of an integrated circuit 100 having a back-end-of-the-line (BEOL) metal stack comprising a via rail configured to mitigate electro-migration.

The integrated circuit 100 comprises a well region 106 arranged within a semiconductor substrate 102. The well region 106 comprises an active area 104 comprising a plurality of source/drain regions 108 arranged within the well region 106. The well region 106 has a first doping type that is opposite a second doping type of the semiconductor substrate 102. The plurality of source/drain regions 108 comprise highly doped regions (e.g., having a doping concentration greater than that of the surrounding semiconductor substrate 102 and/or well region 106) having the second doping type. For example, a PMOS active area formed within a p-type substrate may comprise p-type source/drain regions arranged within an n-well.

A plurality of gate structures 110 (to simplify the illustration, a single gate structure 110 is labeled in the figures) are arranged over the semiconductor substrate 102 between the plurality of source/drain regions 108. The plurality of gate structures 110 are configured to control a flow of charge carriers (e.g., holes or electrons) within a channel region 109 extending between adjacent source/drain regions 108 during operation of a transistor device 107. A plurality of middle-end-of-the-line (MEOL) structures 112 (to simplify the illustration, a single MEOL structure 112 is labeled in the figures) are arranged over the source/drain regions 108 at locations interleaved between the plurality of gate structures 110. The plurality of MEOL structures 112 comprise conductive material arranged in contact with the source/drain regions 108. The plurality of MEOL structures 112 are configured to provide for lateral signal routing (e.g., signal routing in a direction parallel to a top surface of the semiconductor substrate 102).

A plurality of conductive contacts 114 (to simplify the illustration, a single conductive contact 114 is labeled in the figures) are coupled to transistor devices 107 within the semiconductor substrate 102. In some embodiments, the plurality of conductive contacts 114 are arranged onto the plurality of MEOL structures 112. In other embodiments, the plurality of conductive contacts 114 may be arranged onto the plurality of gate structures 110. The plurality of conductive contacts 114 electrically couple the transistor devices 107 to a first metal interconnect wire 116. A via rail 118 is arranged over the first metal interconnect wire 116, and a second metal interconnect wire 120 is arranged on the via rail 118. A second via 122 is arranged on the second metal interconnect wire 120.

The via rail 118 has an elongated shape (e.g., a rectangular shape) with a length $L_{vr}$ extending along a longer axis and a width extending along a shorter axis (i.e., into the plane of the drawing). The length $L_{vr}$ of the via rail 118 is larger than a length $L_c$ of respective ones of the plurality of conductive contacts 114 and/or a length $L_v$ of the second via 122. In some embodiments, the via rail 118 extends past opposing sides of an underlying conductive contact 114 (e.g., from beyond a first sidewall of a conductive contact 114 to beyond an opposing, second sidewall of the conductive contact 114). In some embodiments, the via rail 118 continuously extends over two or more of the conductive contacts 114.

The length $L_{vr}$ of the via rail 118 provides for an increased cross-sectional area between the first metal interconnect wire 116 and the second metal interconnect wire 120 and along a length of the via rail 118. The increased cross-sectional area reduces electro-migration stress and resistance (e.g., the via rail 118 may reduce electro-migration stress by more than 2 times that of traditional via structures). The length $L_{vr}$ of the via rail 118 also enables improved scaling of integrated circuit layouts, since the increased cross-sectional area allows for a cell height to be reduced without significantly increasing electro-migration (e.g., the via rail 118 allows for a cross-sectional area of a current path of a power rail to increase while reducing a width of the power rail).

Figure 2:
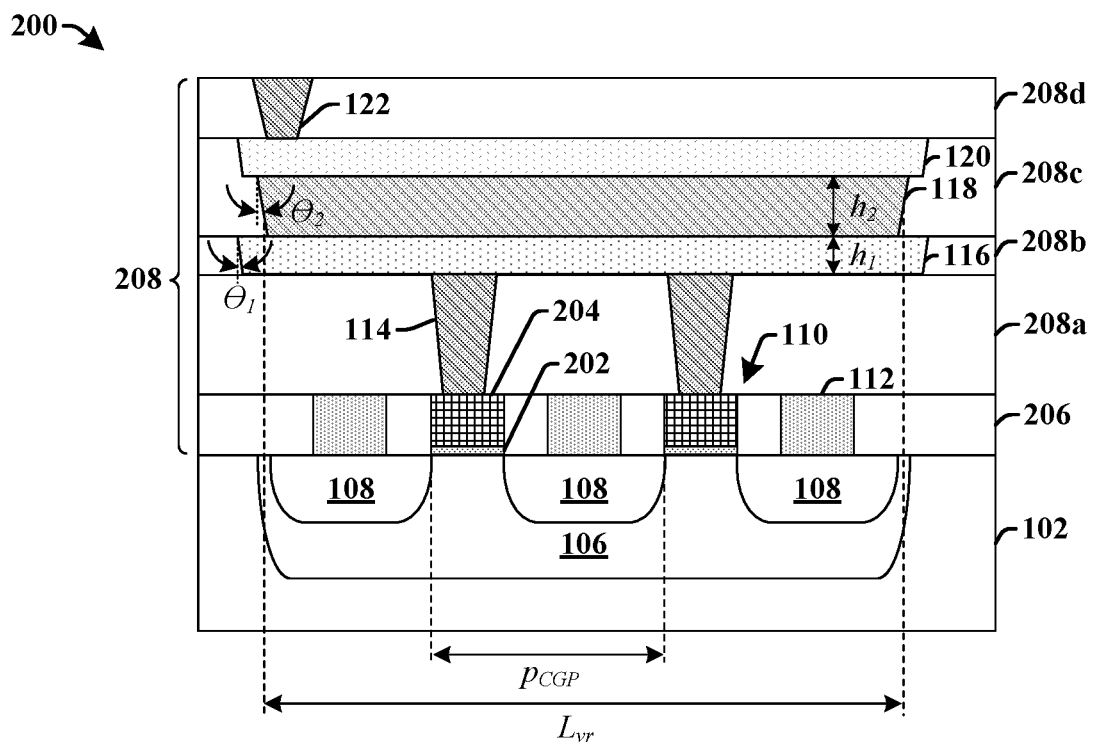
FIG. 2 illustrates a cross-sectional view of some additional embodiments of an integrated circuit having a BEOL metal stack comprising a via rail.

FIG. 2 illustrates a cross-sectional view of some additional embodiments of an integrated circuit 200 having a BEOL metal stack comprising a via rail.

The integrated circuit 200 comprises a plurality of source/drain regions 108 disposed within a well region 106 arranged within a semiconductor substrate 102. A dielectric structure 208 comprising an ILD layer 206 and a plurality of inter-metal dielectric (IMD) layers 208a-208d is arranged over the semiconductor substrate 102. In some embodiments, the ILD layer 206 may comprise an oxide (e.g., $SiO_2$) or a doped silicate glass. In various embodiments, the plurality of IMD layers 208a-208d may comprise one or more of a low-k dielectric layer (i.e., a dielectric with a dielectric constant less than about 3.9), an ultra low-k dielectric layer, or an oxide (e.g., silicon oxide).

A plurality of gate structures 110 are arranged within the ILD layer 206 between adjacent source/drain regions 108. The plurality of gate structures 110 respectively comprise a gate dielectric layer 202 and an overlying gate electrode 204. In various embodiments, the gate dielectric layer 202 may comprise an oxide or a high-k dielectric layer. In some embodiments, the gate electrode 204 may comprise polysilicon or a metal (e.g., aluminum). In some embodiments, sidewall spacers (not shown) may be arranged on opposing sides of the gate structures 110. In some embodiments, the plurality of gate structures 110 are arranged at a contact gate pitch $p_{CGP}$ (i.e., a spacing between left edges of the gate structures 110 or between right edges of the gate structures 110) having values that vary due to misalignment errors by less than or equal to approximately 5%.

A plurality of middle-end-of-the-line (MEOL) structures 112 are also arranged within the ILD layer 206 over the plurality of source/drain regions 108. In some embodiments, the plurality of MEOL structures 112 may have heights that are substantially equal to heights of the plurality of gate structures 110 (i.e., upper surfaces of the plurality of MEOL structures 112 are substantially co-planar with upper surfaces of the gate structures 110). The plurality of MEOL structures 112 may comprise a conductive material such as aluminum, copper, and/or tungsten, for example.

A plurality of conductive contacts 114 are disposed within a first inter-metal dielectric (IMD) layer 208a of the dielectric structure 208. In some embodiments, the conductive contacts 114 may comprise a conductive metal such as tungsten. The plurality of conductive contacts 114 are electrically coupled to a first metal interconnect wire 116 arranged within a second IMD layer 208b overlying the first IMD layer 208a. In some embodiments, the first metal interconnect wire 116 may comprise copper, aluminum, or a copper alloy.

A via rail 118 is arranged onto the first metal interconnect wire 116 and is configured to electrically couple the first metal interconnect wire 116 to an overlying second metal interconnect wire 120. In some embodiments, the via rail 118 may have a length $L_{vr}$ that is greater than the contact gate pitch $p_{CGP}$. In some embodiments, the via rail 118 and the second metal interconnect wire 120 may be arranged within a third IMD layer 208c overlying the second IMD layer 208b. In some embodiments, the via rail 118 and the second metal interconnect wire 120 may comprise copper, aluminum, or a copper alloy.

In some embodiments, the first metal interconnect wire 116 has a first height $h_1$ and sidewalls with a first angle $\theta_1$. The via rail 118 has a second height $h_2$ that is different than the first height $h_1$. In some embodiments, for example, the second height $h_2$ may be greater than the first height $h_1$. In some embodiments, the first metal interconnect wire 116 may have sidewalls with a first angle $\theta_1$ and the via rail 118 may have sidewalls with a second angle $\theta_2$. In some embodiments, the first angle $\theta_1$ is substantially equal to the second angle $\theta_2$. In other embodiments, the first angle $\theta_1$ is different than the second angle $\theta_2$.

Figure 3:
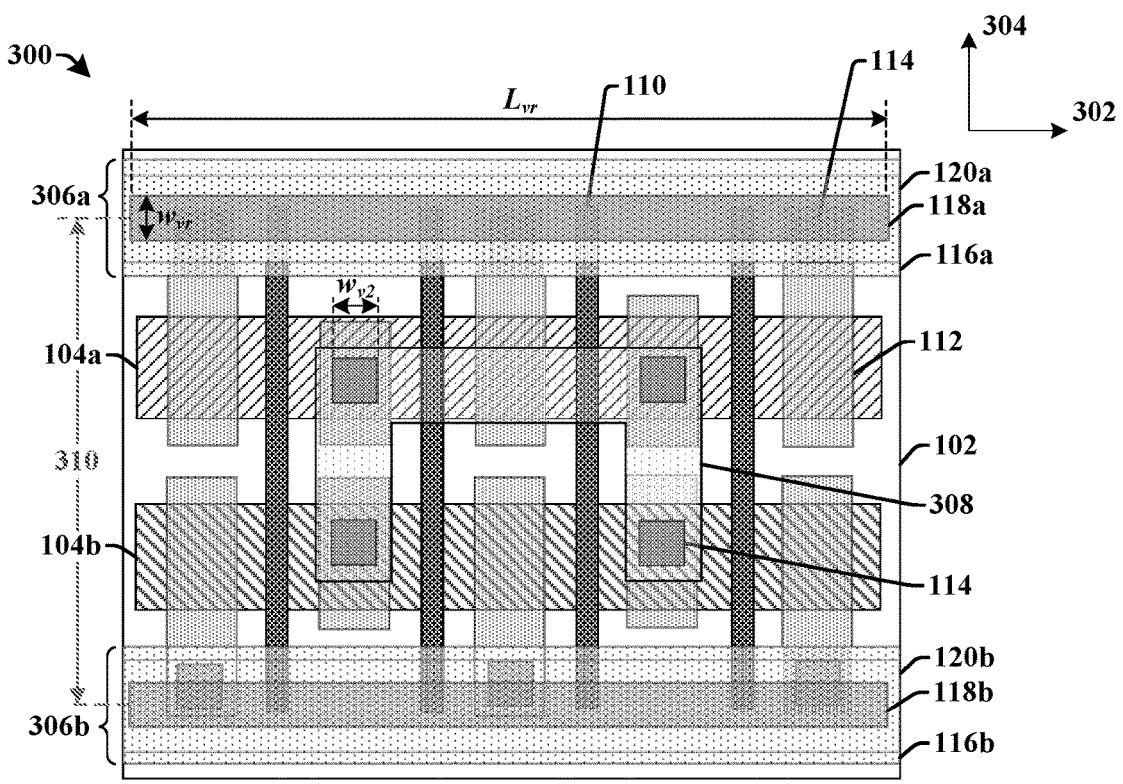
FIG. 3 illustrates a top-view of some additional embodiments of an integrated circuit having a BEOL metal stack comprising a via rail.

FIG. 3 illustrates a top-view of some additional embodiments of an integrated circuit 300 having a BEOL metal stack comprising a via rail.

The integrated circuit 300 comprises a first active area 104a and a second active area 104b arranged within a semiconductor substrate 102. The first active area 104a and the second active area 104b comprise source/drain regions extending along a first direction 302. In some embodiments, source/drain regions within the first active area 104a have different doping types than source/drain regions within the second active area 104b.

A plurality of gate structures 110 extend over the active areas, 104a and 104b, along a second direction 304 that is perpendicular to the first direction 302. A plurality of MEOL structures 112 extend over the active areas, 104a and 104b, along the second direction 304 at locations between the plurality of gate structures 110. The plurality of MEOL structures 112 are coupled to first metal interconnect wires, 116a and 116b, by way of conductive contacts 114. The first metal interconnect wires, 116a and 116b, are separated by the active areas, 104a and 104b, and extend in parallel over the plurality of gate structures 110 along the first direction 302. In some embodiments, an output pin 308 is on a same metal wire layer as the first metal interconnect wires and is coupled to the plurality of MEOL structures 112 by way of the conductive contacts 114.

Second metal interconnect wires, 120a and 120b, extend over the first metal interconnect wires, 116a and 116b, in the first direction 302. The first metal interconnect wires, 116a and 116b, are respectively coupled to the second metal interconnect wires, 120a and 120b, by way of via rails, 118a and 118b. The via rails, 118a and 118b, respectively comprise an elongated shape having a longer dimension extending in the first direction 302. In some embodiments, the via rails, 118a and 118b, have a substantially rectangular footprint. In some embodiments, the first metal interconnect wires, 116a and 116b, and the second metal interconnect wires, 120a and 120b, extend past opposing sidewalls of the via rails, 118a and 118b, in the first direction 302 and in the second direction 304.

The first metal interconnect wires, 116a and 116b, the via rails 118a and 118b, and the second metal interconnect wires, 120a and 120b, collectively comprise power rail structures, 306a and 306b, configured to distribute a voltage potential to multiple devices in the integrated circuit 300. In some embodiments, a first power rail structure 306a may be held at a supply voltage (e.g., $V_{DD}$), while a second power rail structure 306b may be held at a ground voltage (e.g., $V_{SS}$). In various embodiments, the power rail structures, 306a and 306b, may be arranged over or adjacent to the active areas, 104a and 104b.

By placing the via rails, 118a and 118b, respectively between the first metal interconnect wires, 116a and 116b, and the second metal interconnect wires, 120a and 120b, a cross-sectional area of the power rail structures, 306a and 306b, is increased. Increasing the cross-sectional area of the power rail structures, 306a and 306b, decreases electro-migration, and therefore also allows for a cell height 310 to be scaled without degrading electro-migration of the integrated circuit 300.

Figure 4:
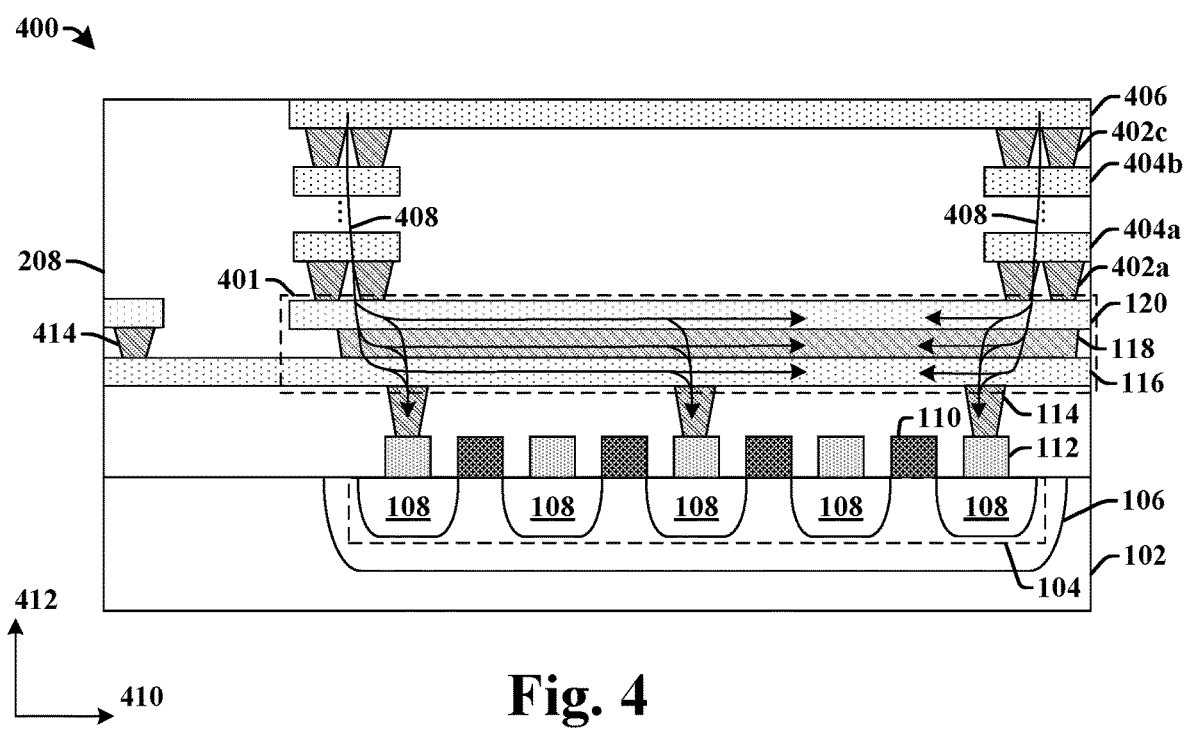
FIG. 4 illustrates a cross-sectional view of some additional embodiments of an integrated circuit having a via rail.

FIG. 4 illustrates a cross-sectional view of some additional embodiments of an integrated circuit 400 having a via rail.

The integrated circuit 400 comprises a plurality of metal interconnect layers arranged within a dielectric structure 208 overlying a semiconductor substrate 102. The plurality of metal interconnect layers comprise a local power rail structure 401 comprising a first metal interconnect wire 116, a via rail 118, and a second metal interconnect wire 120. In some embodiments, the plurality of metal interconnect layers further comprise a second power rail arranged on an upper metal interconnect wire 406 over the second metal interconnect wire 120. In such embodiments, the upper metal interconnect wire 406 may be held at a selected voltage (e.g., $V_{SS}$ or $V_{DD}$). The upper metal interconnect wire 406 is coupled to the second metal interconnect wire 120 by way of a plurality of stacked intermediate metal interconnect wires 404a-404b and one or more intermediate vias 402a-402c. The via rail 118 continuously extends between first and second columns of the stacked intermediate metal interconnect wires 404a-404b and one or more intermediate vias 402a-402c, so as to provide current paths 408 having a relatively large cross-sectional area.

For example, during operation current travels from the upper metal interconnect wire 406 to the second metal interconnect wire 120 through the current paths 408. Since the size of the upper metal interconnect wire 406 is relatively large, the current density of the upper metal interconnect wire 406 is relatively small. However, the small size of the first and second metal interconnect wires, 116 and 120, causes the current density to increase (e.g., due to small cross-sectional area). The via rail 118 reduces the current density within the first metal interconnect wire 116 and the second metal interconnect wire 120 by increasing a cross-sectional area in a first direction 410 parallel to a surface of the semiconductor substrate 102 and in a second direction 412 perpendicular to the surface of the semiconductor substrate 102.

In some embodiments, a via 414 is arranged over the first metal interconnect wire 116 at a location offset from the via rail 118. The via 414 and the via rail 118 have a same width (into the plane of the drawing) and different lengths (in direction 410). For example, in some embodiments, the via rail 118 has length (in direction 410) that is more than five times a length of the via 414. In other embodiments, the via rail 118 has length that is more than ten times a length of the via 414.

Although the power rail structure 401 is shown as being on a first metal interconnect wire (e.g., a 'M1' layer) and a second metal interconnect wire (e.g., a 'M2' layer), it will be appreciated that power rail structure (e.g., metal interconnect wires held at $V_{DD}$ or $V_{SS}$) may be arranged on additional and/or different metal wire layers separated by a via rail. For example, the power rail structure may comprise a third metal interconnect wire (e.g., a 'M3' layer), a fourth metal interconnect wire (e.g., a 'M4' layer), and a via rail located therebetween. Alternatively, the power rail structure may comprise the first metal interconnect wire 116, the second metal interconnect wire 120, the via rail 118, a third metal interconnect wire over the second metal interconnect wire 120 and a second via rail between the second metal interconnect wire 120 and the third metal interconnect wire, for example.

Figure 5:
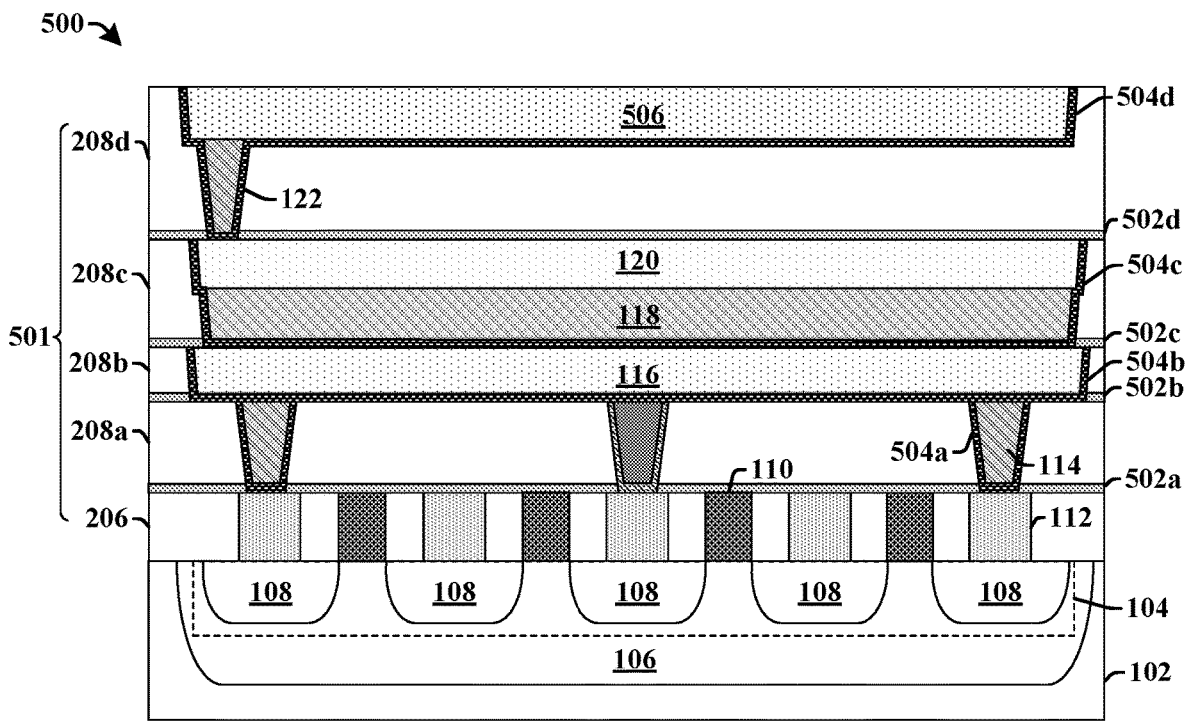
FIG. 5 illustrates some additional embodiments of a cross-sectional view an integrated circuit having a BEOL metal stack comprising a via rail.

FIG. 5 illustrates a cross-sectional view of some additional embodiments of an integrated circuit 500 having a BEOL metal stack comprising a via rail.

The integrated circuit 500 comprises a dielectric structure 501 disposed over a semiconductor substrate 102. The dielectric structure 501 comprises a plurality of stacked dielectric layers (e.g., a low-k dielectric material, an oxide material, un-doped SiO$_2$, fluorosilicate glass, etc.) including an ILD layer 206 and a plurality of IMD layers 208a-208d. In some embodiments, the plurality of stacked dielectric layers are separated by a plurality of etch stop layers 502a-502d. For example, the ILD layer 206 is separated from the first IMD layer 208a by a first etch stop layer (ESL) 502a, the first IMD layer 208a is separated from a second IMD layer 208b by a second ESL 502b, etc. In various embodiments, the plurality of etch stop layers 502a-502d may comprise titanium nitride (TiN) and/or tantalum nitride (TaN).

A plurality of conductive contacts 114 are arranged within the ILD layer 206. A first diffusion barrier liner 504a separates the plurality of conductive contacts 114 from the ILD layer 206. The first diffusion barrier liner 504a is configured to prevent diffusion of metal atoms from the plurality of conductive contacts 114 to the ILD layer 206. In some embodiments, the first diffusion barrier liner 504a may comprise tantalum (Ta) or titanium nitride (TaN). In some embodiments, the first diffusion barrier liner 504a is located in direct contact with the first ESL 502a.

A first metal interconnect wire 116 is arranged within the first IMD layer 208a. A second diffusion barrier liner 504b separates the first metal interconnect wire 116 from the first IMD layer 208a. The second diffusion barrier liner 504b also separates the first metal interconnect wire 116 from the plurality of conductive contacts 114. A second metal interconnect wire 120 is arranged over the first metal interconnect wire 116. In various embodiments, the first and second metal interconnect wires, 116 and 120, may comprise a conductive material, such as copper, aluminum, titanium, tungsten, etc.

The first metal interconnect wire 116 is electrically coupled to the second metal interconnect wire 120 by a via rail 118. An upper surface of the via rail 118 is in direct contact with the second metal interconnect wire 120. A third diffusion barrier liner 504c separates the via rail 118 and the second metal interconnect wire 120 from the second IMD layer 208b. The third diffusion barrier liner 504c also separates a lower surface of the via rail 118 from the first metal interconnect wire 116. A second via 122 is arranged within a third IMD layer 208c and a third metal interconnect wire 506 is arranged on the second via 122. The second via 122 is separated from the third IMD layer 208c by a fourth diffusion barrier liner 504d.

Figure 6A:
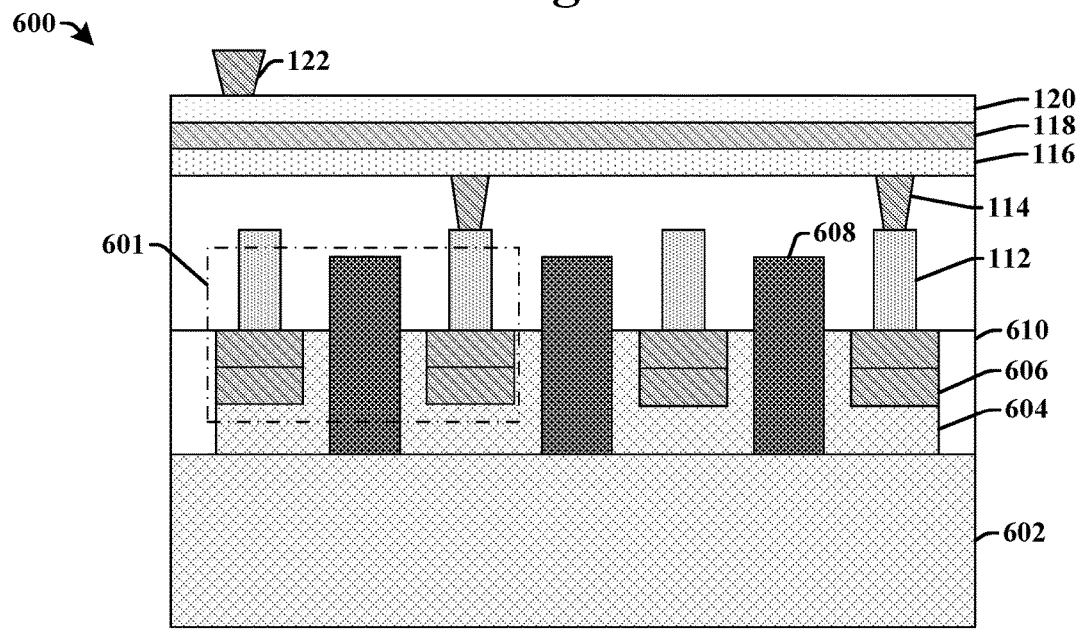
FIGS. 6A-6B illustrate some embodiments of an integrated circuit comprising a back-end-of-the-line (BEOL) metal stack with a via rail arranged over a plurality of FinFET devices.
Figure 6B:
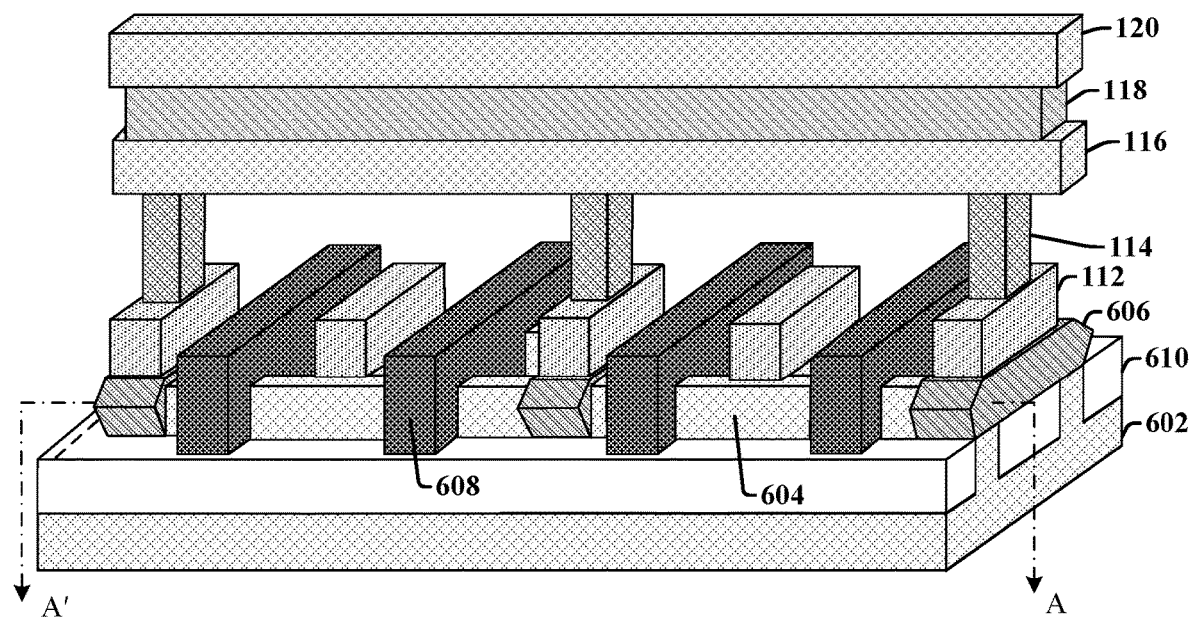

Although FIGS. 1-5 illustrate integrated circuits having a back-end-of-the-line (BEOL) metal stack arranged over planar transistors, it will be appreciated that the BEOL metal stack disclosed herein may also be used in conjunction with FinFET devices. FIGS. 6A-6B illustrate some embodiments of an integrated circuit comprising a back-end-of-the-line (BEOL) metal stack with a via rail arranged over a plurality of FinFET devices.

FIG. 6A illustrates a cross-sectional view of an integrated circuit 600 comprising a BEOL metal stack with a via rail 118 arranged over a plurality of FinFET devices 601. FIG. 6B illustrates a three-dimensional view 612 of the integrated chip 600 (cross-sectional view of FIG. 6A shown along line A-A').

The integrated chip 600 comprises a fin of semiconductor material 604 protruding from an underlying semiconductor substrate 602. In some embodiments, the fin of semiconductor material 604 comprises the same material as the semiconductor substrate 602. Epitaxial source/drain regions 606 are arranged within the fin of semiconductor material 604.

A plurality of gate structures 608 (to simplify the illustration, a single gate structure 608 is labeled in the figures) are disposed over the semiconductor substrate 602. The plurality of gate structures 608 straddle the fin of semiconductor material 604. The plurality of gate structures 608 are configured to control the flow of charge carriers within the fin of semiconductor material 604. In some embodiments, the plurality of gate structures 608 may comprise a gate electrode and a gate dielectric layer 202, which separates the gate electrode from the fin of semiconductor material 604.

A dielectric layer 610 is arranged over the semiconductor substrate 602. The dielectric layer 610 extends along a planar surface of the semiconductor substrate 602, and along sidewalls and an upper surface of the fin of semiconductor material 604. In some embodiments, the dielectric layer 610 may comprise a silicon dioxide (SiO$_2$) layer.

A plurality of middle-end-of-the-line (MEOL) structures 112 (to simplify the illustration, a single MEOL structure 112 is labeled in the figures) are arranged over the epitaxial source/drain regions 606 at locations interleaved between the plurality of gate structures 608. A plurality of conductive contacts 114 (to simplify the illustration, a single conductive contact 114 is labeled in the figures) are coupled to FinFET devices 601 within the semiconductor substrate 602. In some embodiments, the plurality of conductive contacts 114 are arranged onto the plurality of MEOL structures 112. In other embodiments, the plurality of conductive contacts 114 may be arranged onto the plurality of gate structures 608. The plurality of conductive contacts 114 electrically couple the transistor devices 107 to a first metal interconnect wire 116. A via rail 118 is arranged over the first metal interconnect wire 116, and a second metal interconnect wire 120 is arranged on the via rail 118. A second via 122 is arranged on the second metal interconnect wire 120. In some embodiments, the via rail 118 continuously extends over two or more of the conductive contacts 114.

FIGS. 7-17 illustrate cross-sectional views 700-1700 of some embodiments of a method of forming a via rail within a back-end-of-the-line (BEOL) metal stack.

As shown in cross-sectional view 700, a well region 106 is formed within a semiconductor substrate 102. In various embodiments, the semiconductor substrate 102 may be any type of semiconductor body (e.g., silicon, SiGe, SOI) such as a semiconductor wafer and/or one or more dies on a wafer, as well as any other type of metal layer, device, semiconductor and/or epitaxial layers, etc., associated therewith. The semiconductor substrate 102 may comprise an intrinsically doped semiconductor substrate having a first doping type (e.g., an n-type doping or a p-type doping).

The well region 106 may be formed by selectively implanting a dopant species 702 into the semiconductor substrate 102 (e.g., an n-well may be formed within a p-type substrate, to form a PMOS active area, by implanting a p-type dopant into the substrate prior to the formation of the gate structures). In some embodiments, the dopant species 702 may be selectively implanted into the semiconductor substrate 102 according to a first masking layer 704 arranged over the semiconductor substrate 102. In some embodiments, the first masking layer 704 may comprise a photoresist layer. In such embodiments, the first masking layer 704 may be patterned by selectively exposing a photoresist layer to radiation, and subsequently developing the photoresist layer.

As shown in cross-sectional view 800, a plurality of gate structures 110 are formed over the well region 106. The plurality of gate structures 110 comprise a gate electrode 204 separated from the semiconductor substrate 102 by a gate dielectric layer 202. In some embodiments, the plurality of gate structures 110 may be formed by forming a gate dielectric layer over the semiconductor substrate 102 and subsequently forming a gate electrode layer over the gate dielectric layer. The gate dielectric layer and the gate electrode layer are subsequently patterned according to a photolithography process to form the plurality of gate structures 110.

As shown in cross-sectional view 900, a plurality of source/drain regions 108 are formed within the well region 106. In some embodiments, the plurality of source/drain regions 108 may be formed by selectively implanting a dopant species 902 into the semiconductor substrate 102 according to the gate structures 110 and a second masking layer 904. In various embodiments, the dopant species 902 may comprise a p-type dopant (e.g., boron, gallium, etc.) or an n-type dopant (e.g., phosphorus, arsenic, etc.). In some embodiments, the dopant species 902 may be driven into the semiconductor substrate 102 by performing a subsequent high-temperature anneal. In some alternative embodiments, the source/drain regions 108 may be formed by etch and epitaxial growth processes at a location within or overlying the semiconductor substrate 102.

As shown in cross-sectional view 1000, a plurality of middle-end-of-the-line (MEOL) structures 112 are formed over the plurality of source/drain regions 108 at locations laterally interleaved between the plurality of gate structures 110. In some embodiments, the plurality of MEOL structures 112 are formed by depositing an inter-level dielectric (ILD) layer 206 over the semiconductor substrate 102. The ILD layer 206 is subsequently etched to form openings that are filled with a conductive material to form the plurality of MEOL structures 112. In other embodiments, the plurality of MEOL structures 112 may be formed prior to the formation of the ILD layer 206.

As shown in cross-sectional view 1100, a first inter-metal dielectric (IMD) layer 208a is formed over the ILD layer 206. In some embodiments, a first etch stop layer (ESL) 502a is formed over the ILD layer 206 prior to the formation of the first IMD layer 208a, so that the first ESL 502a separates the ILD layer 206 from the first IMD layer 208a. In some embodiments, the first ESL 502a may comprise a titanium nitride layer or tantalum layer deposited by a physical vapor deposition process (e.g., PVD, CVE, PE-CVD, ALD, etc.). In some embodiments, the first IMD layer 208a may comprise a low-k dielectric layer formed by a physical vapor deposition process. The first IMD layer 208a is subsequently exposed to an etchant 1102 according to a third masking layer 1104 (e.g., a photoresist layer) to form a plurality of conductive contact holes 1106.

As shown in cross-sectional view 1200, a first diffusion barrier liner 504a is deposited in the conductive contact holes 1106. The first diffusion barrier liner 504a is arranged along sidewalls and a lower surface of the conductive contact holes 1106. In some embodiments, the first diffusion barrier liner 504a may be deposited using a physical vapor deposition processes (e.g., PVD, CVD, etc.). A conductive material (e.g., copper, tungsten, and/or aluminum) is formed within the conductive contact holes 1106 to form a plurality of conductive contacts 114. In some embodiments, the conductive material may be formed by first depositing a seed layer 1202 within the conductive contact holes 1106, followed by a subsequent plating process (e.g., an electroplating process, an electro-less plating process, etc.) to fill the conductive contact holes 1106 (with a conductive fill 1204). In some embodiments, a chemical mechanical polishing (CMP) process may be subsequently performed.

As shown in cross-sectional view 1300, a second IMD layer 208b is formed over the first IMD layer 208a. In some embodiments, a second ESL 502b is formed over the first IMD layer 208a, so that the second ESL 502b separates the first IMD layer 208a from the second IMD layer 208b. A first metal interconnect wire 116 is formed within the second IMD layer 208b. In some embodiments, the first metal interconnect wire 116 may be formed by forming the second IMD layer 208b over the first IMD layer 208a, and subsequently etching the second IMD layer 208b to form a first metal wire trench 1302. A second diffusion barrier liner 504b is deposited in the first metal wire trench 1302. The first metal wire trench 1302 is then filled with a conductive material (e.g., tungsten, copper, or aluminum copper) to form the first metal interconnect wire 116.

As shown in cross-sectional view 1400, a third IMD layer 208c is formed over the second IMD layer 208b. In some embodiments, a third ESL 502c is formed between the second IMD layer 208b and the third IMD layer 208c. The third IMD layer 208c is exposed to a first etchant 1402 according to a fourth masking layer 1404 to form a via rail hole 1406 extending into an upper surface of the third IMD layer 208c. In some embodiments, the via rail hole 1406 extends along the upper surface of the third IMD layer 208c over two or more of the plurality of conductive contacts 114.

As shown in cross-sectional view 1500, the third IMD layer 208c is exposed to a second etchant 1502 according to a fifth masking layer 1504 to form a second metal wire trench 1506 extending into the upper surface of the third IMD layer 208c. The via rail hole 1406 and the second metal wire trench 1506 collectively extend from the upper surface of the third IMD layer 208c to the third ESL 502c. In some embodiments, the etching operations shown in cross-sectional views 1400 and 1500 may be performed in a reverse order (e.g., so that the second metal wire trench 1506 is formed prior to forming the via rail hole 1406).

As shown in cross-sectional view 1600, a third diffusion barrier liner 504c is deposited along sidewalls and lower surfaces of the via rail hole 1406 and the second metal wire trench 1506. A conductive material (e.g., copper, tungsten, and/or aluminum) is subsequently formed within the via rail hole 1406 and the second metal wire trench 1506. In some embodiments, the conductive material may be formed by first depositing a seed layer within the via rail hole 1406 and the second metal wire trench 1506, followed by a subsequent plating process (e.g., an electroplating process, an electro-less plating process) to fill the via rail hole 1406 and the second metal wire trench 1506. In some embodiments, a chemical mechanical polishing (CMP) process may be subsequently performed.

As shown in cross-sectional view 1700, a fourth IMD layer 208d is formed over the third IMD layer 208c. In some embodiments, a fourth ESL 502d is formed between the third IMD layer 208c and the fourth IMD layer 208d. The fourth IMD layer 208d is etched to form a second via hole 1702 and an overlying third metal wire trench 1704. A fourth diffusion barrier liner 504d is deposited along sidewalls and lower surfaces of the second via hole 1702 and the third metal wire trench 1704. A conductive material (e.g., copper, tungsten, and/or aluminum) is subsequently formed within the second via hole 1702 and the third metal wire trench 1704 to form a via 122 and a third metal interconnect wire 520.

Figure 17:
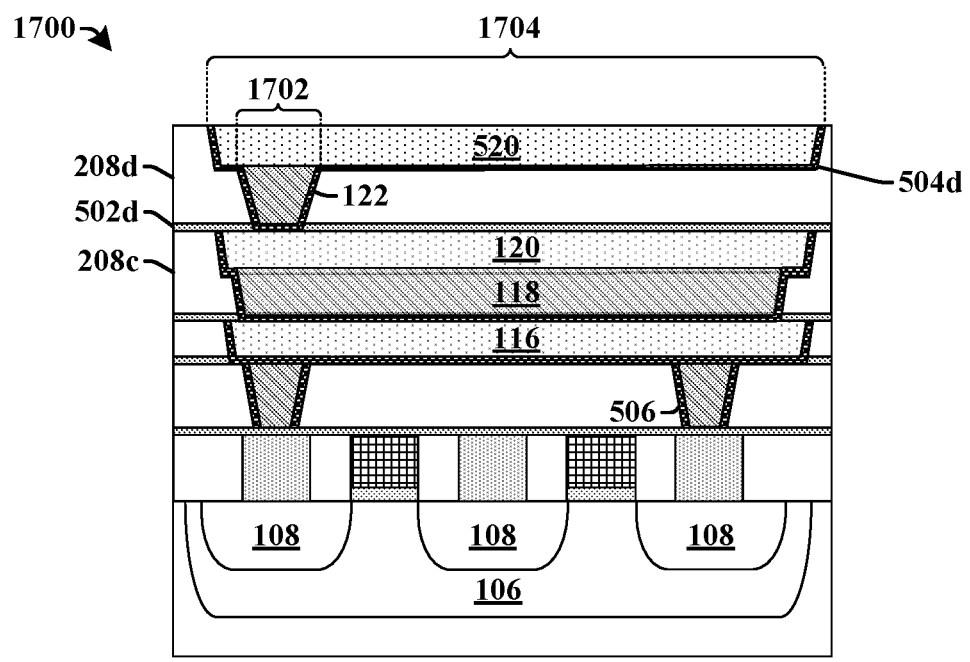
Figure 18:
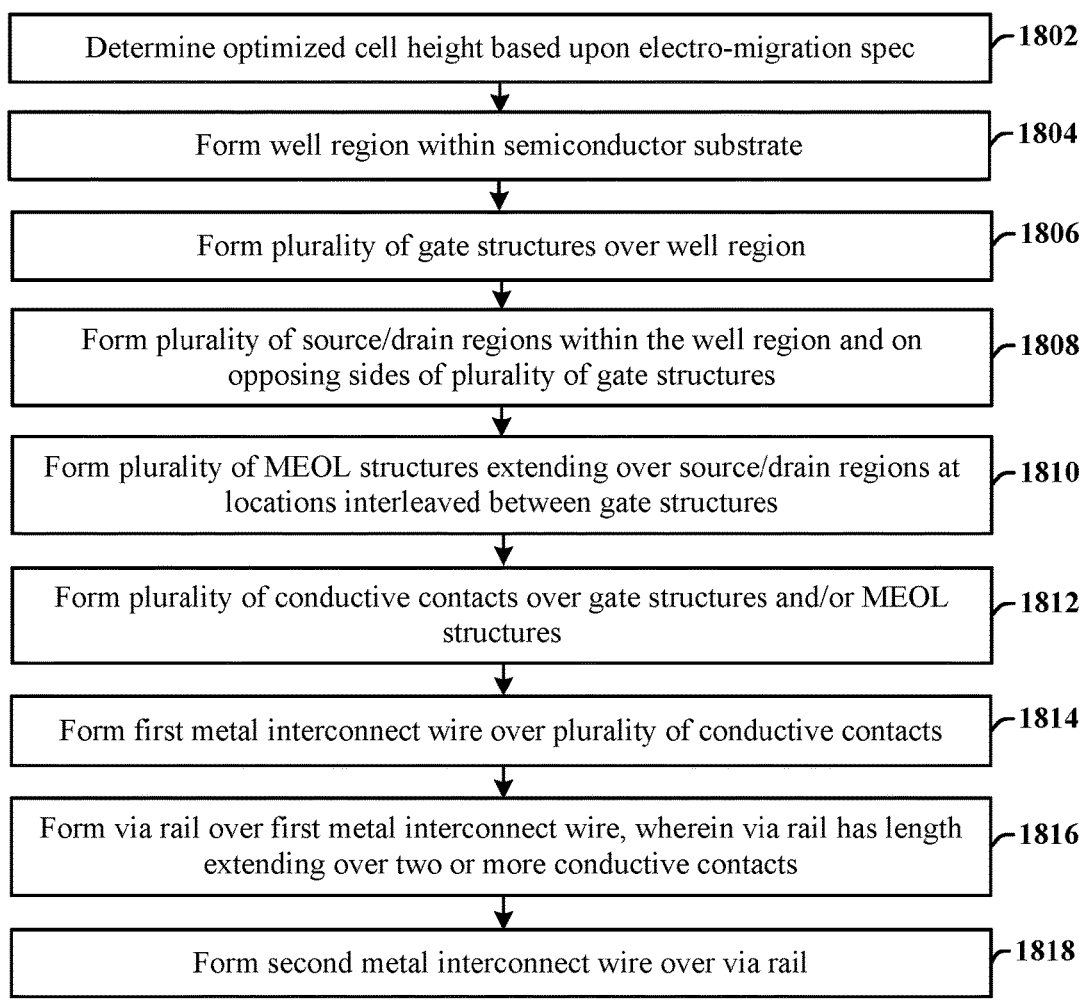
FIG. 18 illustrates a flow diagram of some embodiments of a method of forming an integrated circuit having a BEOL metal stack comprising a via rail.

FIG. 18 illustrates a flow diagram of some embodiments of a method 1800 of forming an integrated circuit having a BEOL metal stack comprising a via rail. Although method 1800 is described in relation to FIGS. 7-17, it will be appreciated that the method 1800 is not limited to such structures, but instead may stand alone as a method independent of the structures.

Furthermore, while the disclosed methods (e.g., methods 1700 and 1800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 19:
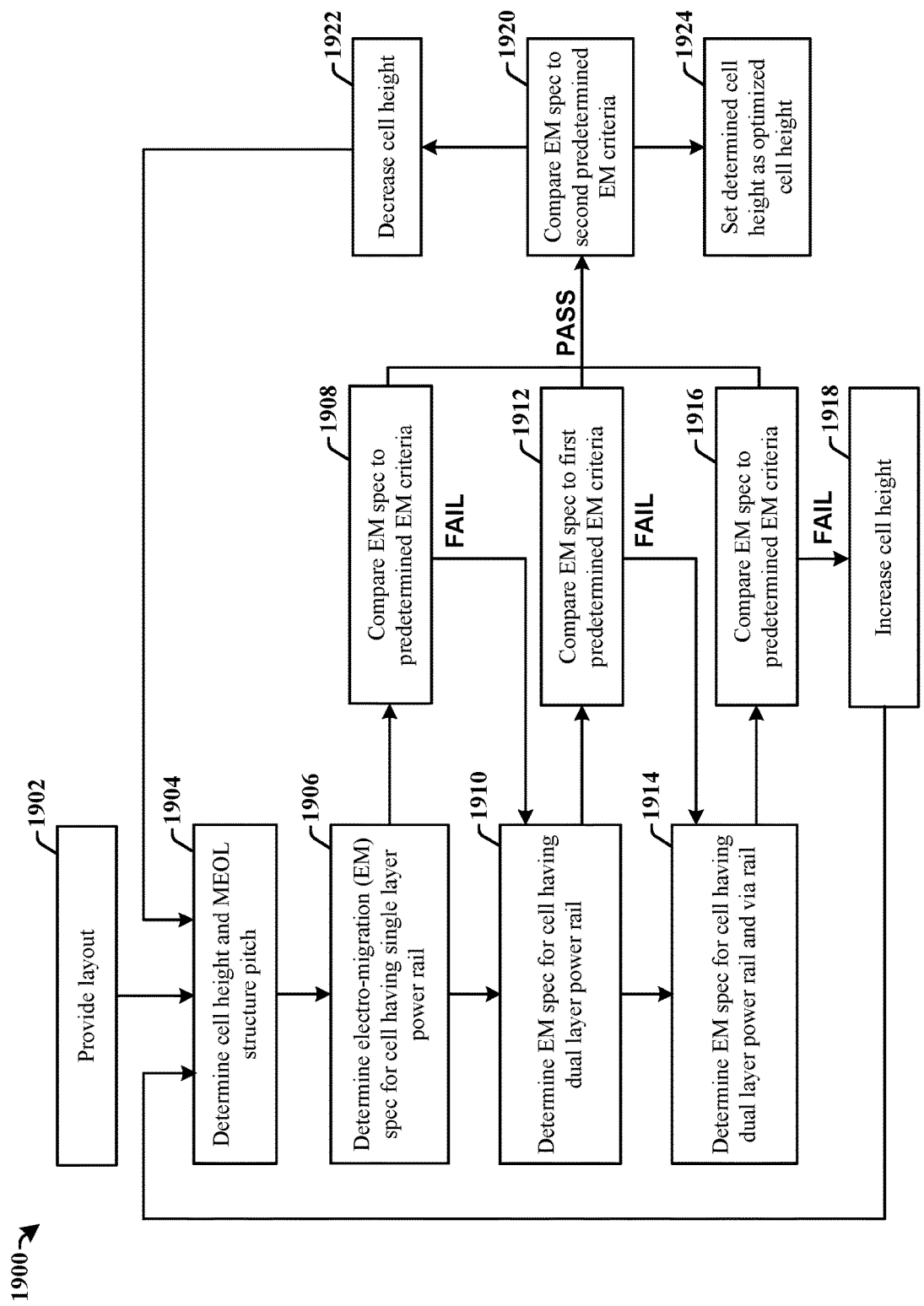
FIG. 19 illustrates a flow diagram of some embodiments of a method of determining an optimized cell height for scaling based on electro-migration specifications.

At 1802, an optimized height of a cell may be determined in some embodiments. In some embodiments, the optimized cell height may be determined based upon electro-migration specifications of simulations run on a cell layout. This is because the cell height impacts a width of the power rails (e.g., a smaller cell height will have a smaller power rail width than a larger cell height), such that the electro-migration specifications of the power rail may be a limiting factor of the optimized cell height. FIG. 19 illustrates a method 1900 of some embodiments corresponding to act 1802.

Figure 7:
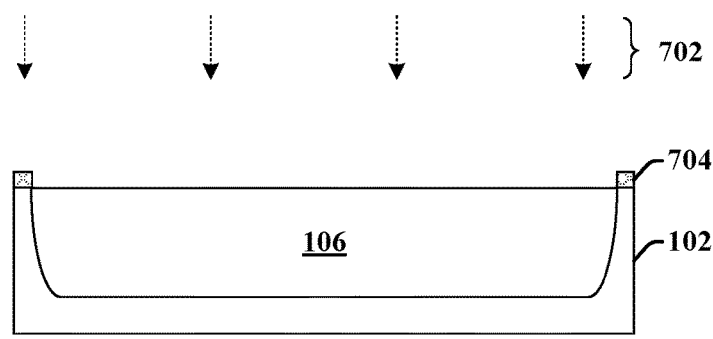
FIGS. 7-17 illustrate cross-sectional views of some embodiments of a method of forming an integrated circuit having a BEOL metal stack comprising a via rail.

At 1804, a well region is formed within a semiconductor substrate. The well region may have a width that is determined based upon the optimized cell height. FIG. 7 illustrates a cross-sectional view 700 of some embodiments corresponding to act 1804.

Figure 8:
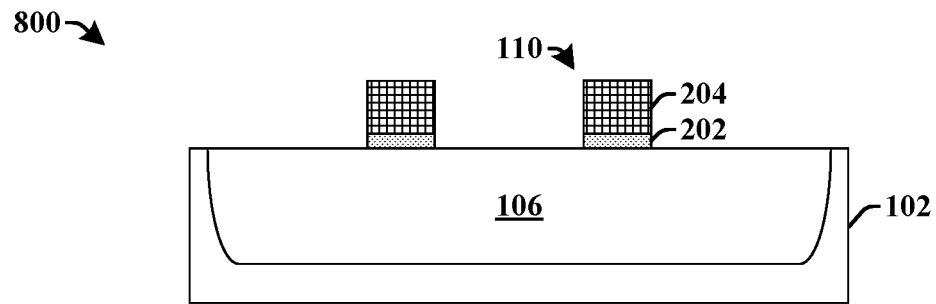

At 1806, a plurality of gate structures are formed over the well region. FIG. 8 illustrates a cross-sectional view 800 of some embodiments corresponding to act 1806.

Figure 9:
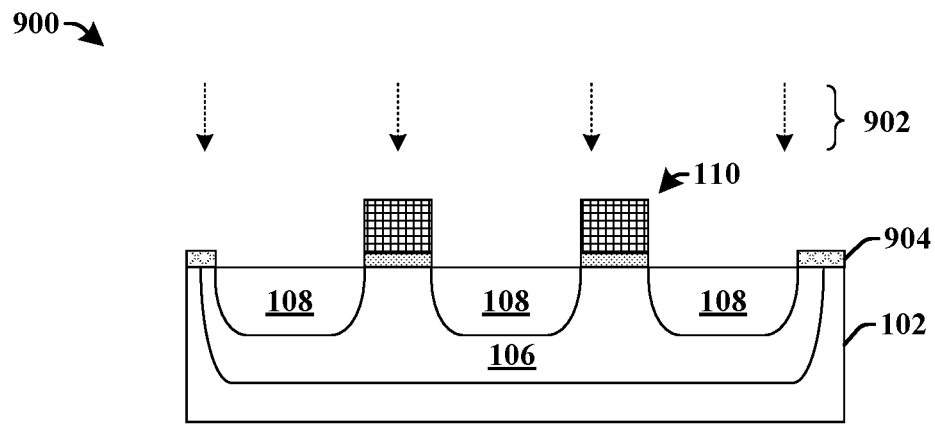

At 1808, a plurality of source/drain regions are formed within the well region on opposing sides of the plurality of gate structures. FIG. 9 illustrates a cross-sectional view 900 of some embodiments corresponding to act 1808.

Figure 10:
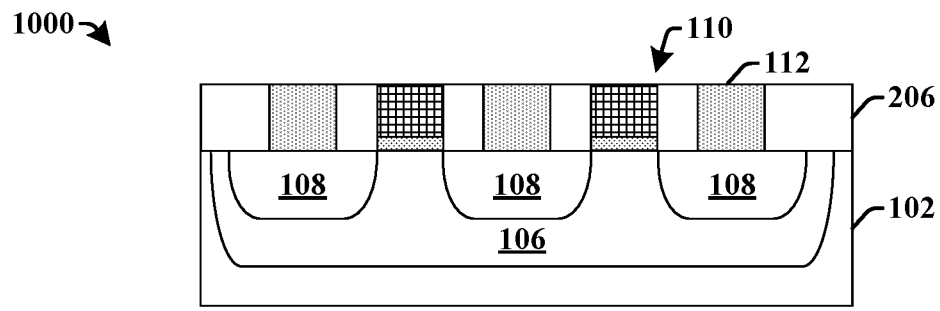

At 1810, a plurality of middle-end-of-the-line (MEOL) structures are formed over the well region interleaved between the plurality of gate structures. FIG. 10 illustrates a cross-sectional view 1000 of some embodiments corresponding to act 1810.

Figure 11:
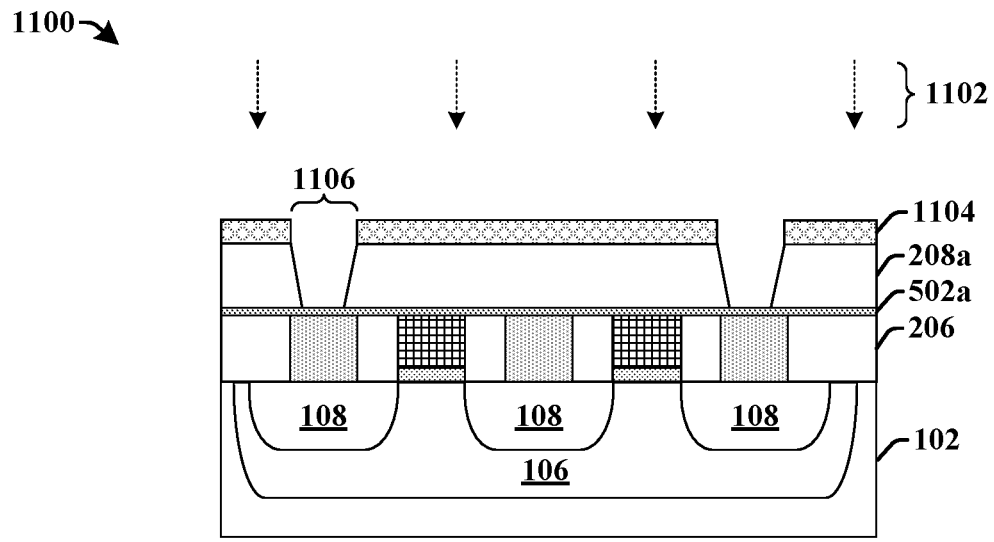
Figure 12:
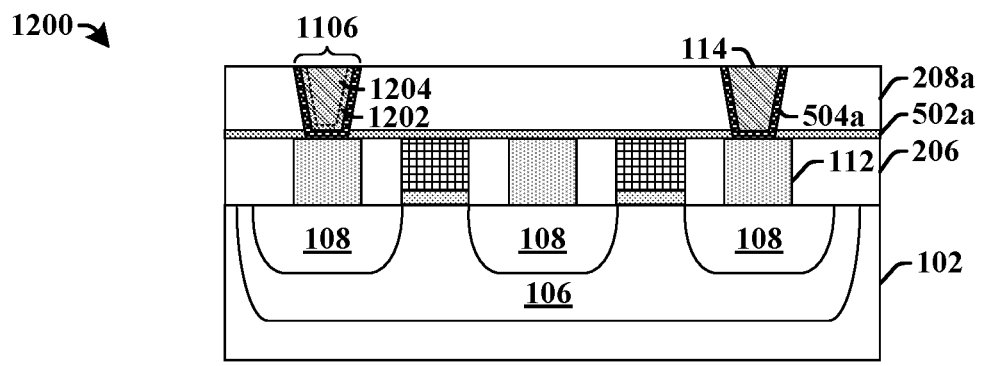

At 1812, a plurality of conductive contacts are formed over the gate structures and/or the MEOL structures. FIGS. 11-12 illustrate cross-sectional views 1100-1200 of some embodiments corresponding to act 1812.

Figure 13:
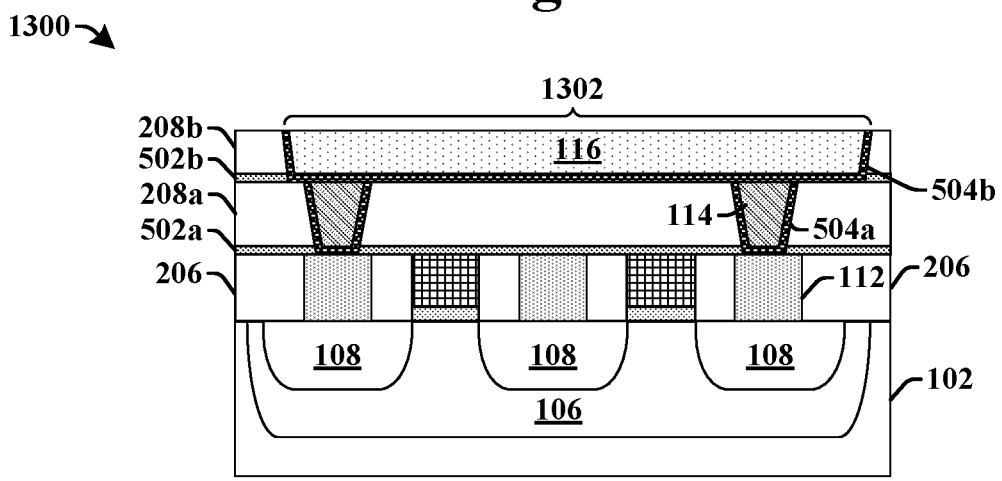
Figure 14:
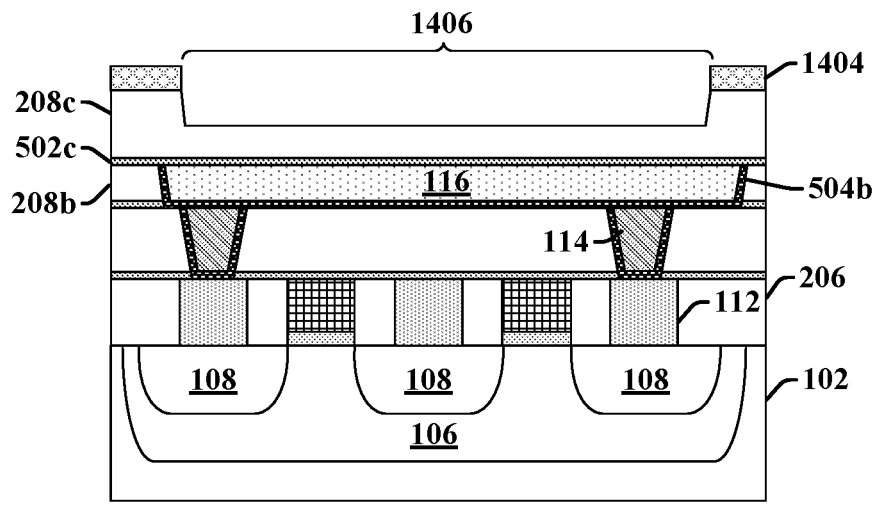

At 1814, a first metal interconnect wire is formed over the plurality of conductive contacts. FIG. 13 illustrates a cross-sectional view 1300 of some embodiments corresponding to act 1814.

Figure 15:
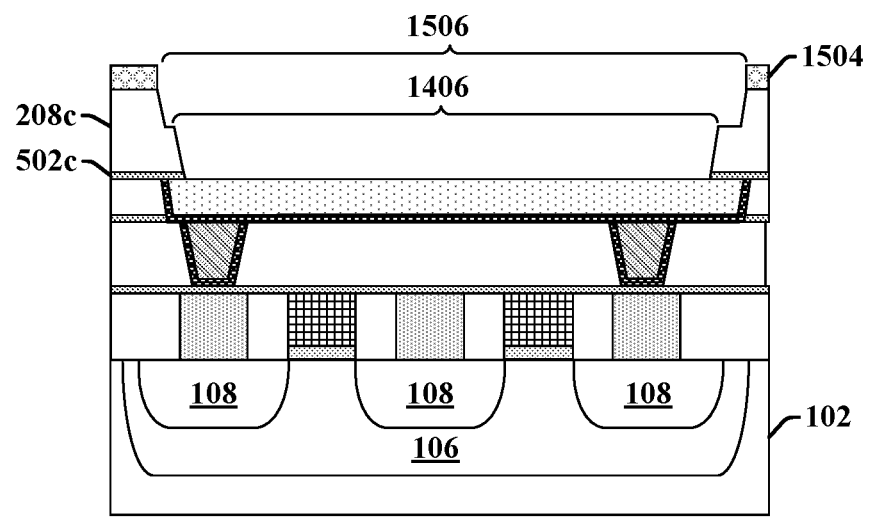
Figure 16:
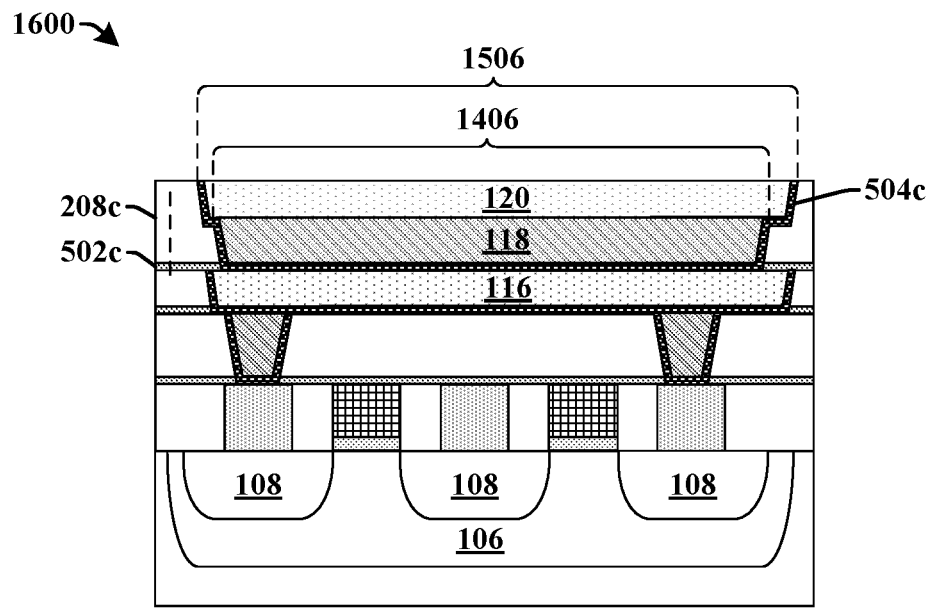

At 1816, a via rail is formed over the first metal interconnect wire. The via rail has a length that extends over two or more of the conductive contacts. FIGS. 15-16 illustrate cross-sectional views 1400-1600 of some embodiments corresponding to act 1816.

At 1818, a second metal interconnect wire is formed over the via rail. FIG. 17 illustrates a cross-sectional view 1700 of some embodiments corresponding to act 1818.

FIG. 19 illustrates a flow diagram of some embodiments of a method 1900 of determining a cell height based on electro-migration specifications.

At 1902, an integrated circuit layout is provided. The integrated circuit layout has an initial cell height (e.g., between a first power rail held at $V_{DD}$ and a second power rail held at $V_{SS}$) and MEOL structure pitch.

At 1904, a cell height and MEOL structure pitch is determined. The cell height and MEOL structure pitch correspond to a cross-sectional area between a power rail and a transistor device within an active area of a cell.

At 1906, a first electro-migration specification is determined for an integrated circuit layout having a single power rail structure (e.g., a power rail that is a first metal interconnect wire) within a cell having the determined cell height and MEOL structure pitch. In some embodiments, the first electro-migration specification may be determined using a simulation (e.g., SPICE).

At 1908, the first electro-migration specification is compared to a first predetermined electro-migration criteria. If the first electro-migration specification violates the first predetermined electro-migration criteria, the method 1900 proceeds to 1910. If the first electro-migration specification does not violate the first predetermined electro-migration criteria, the method 1900 proceeds to 1920.

At 1910, a second electro-migration specification is determined for an integrated circuit layout having a dual power rail structure (e.g., a power rail that is a first metal interconnect wire and an overlying second metal interconnect wire) within a cell having the initial cell height and MEOL structure pitch.

At 1912, the second electro-migration specification may be compared to the first predetermined electro-migration criteria. If the second electro-migration specification violates the first predetermined electro-migration criteria, the method 1900 proceeds to 1914. If the second electro-migration specification does not violate the first predetermined electro-migration criteria, the method 1900 proceeds to 1920.

At 1914, a third electro-migration specification is determined for an integrated circuit layout having a dual power rail structure with a via rail (e.g., a power rail that is a first metal wire layer and a second metal wire layer coupled by a via rail) within a cell having the determined cell height and MEOL structure pitch.

At 1916, the third electro-migration specification may be compared to the first predetermined electro-migration criteria. If the third electro-migration specification violates the first predetermined electro-migration criteria, the method 1900 proceeds to 1918. If the third electro-migration specification does not violate the first predetermined electro-migration criteria, the method 1900 proceeds to 1920.

At 1918, the cell height is increased. Increasing the cell height allows for the width of the power rails to be increased, thereby reducing the electro-migration specification. The method 1900 then repeats acts 1904-1916 using the new cell height.

At 1920, the first, second, or third electro-migration specification is compared to a second predetermined electro-migration criteria. If the first, second or third electro-migration specification do not violate the second predetermined electro-migration criteria, the first, second or third electro-migration specification pass the second predetermined electro-migration criteria by a relatively large amount, and the cell height can be further reduced at 1922. The method 1900 then repeats acts 1904-1916 using the new cell height.

However, if the first, second, or third electro-migration specification violates the second pre-determined electro-migration criteria, the first, second, or third electro-migration specifications marginally pass the second predetermined electro-migration criteria and the determined cell height is set as an optimized cell height (at 1924).

Therefore, the present disclosure relates to an integrated circuit having back-end-of-the-line (BEOL) metal stack that with a power rail structure, comprising two metal wire layers and an intervening via rail, which enables proper cell scaling while preventing reliability concerns such as electro-migration and/or IR issues.

In some embodiments, the present disclosure relates to an integrated circuit. The integrated circuit comprises a plurality of conductive contacts arranged over a semiconductor substrate. A first metal interconnect wire is arranged over the plurality of conductive contacts, and a second metal interconnect wire is arranged over the first metal interconnect wire. A via rail is arranged over the first metal interconnect wire and is configured to electrically couple the first metal interconnect wire and the second metal interconnect wire. The via rail has a length that continuously extends over two or more of the plurality of conductive contacts.

In other embodiments, the present disclosure relates to an integrated circuit. The integrated circuit comprises an active area comprising plurality of source/drain regions arranged within a well region disposed in a substrate. A plurality of gate structures are arranged over the substrate between adjacent ones of the plurality of source/drain regions at a contact gate pitch, and a plurality of middle-end-of-the-line (MEOL) structures are arranged on the plurality of source/drain regions. A plurality of conductive contacts are arranged over the plurality of MEOL structures. A first metal interconnect wire is arranged over the plurality of conductive contacts, and a second metal interconnect wire arranged over the first metal interconnect wire. A via rail is configured to electrically couple the first metal interconnect wire and the second metal interconnect wire. The via rail has a length that is greater than the contact gate pitch.

In yet other embodiments, the present disclosure relates to a method of forming an integrated circuit. The method comprises forming a plurality of conductive contacts over a semiconductor substrate. The method further comprises forming a first metal interconnect wire over the plurality of conductive contacts. The method further comprises forming a via rail over the first metal interconnect wire, wherein the via rail has a length that continuously extends over two or more of the plurality of conductive contacts. The method further comprises forming a second metal interconnect wire onto the via rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
    forming a first source region and a second source region within a substrate, the first source region and the second source region separated by a drain region along a first direction;
    forming a first middle-end-of-the-line (MEOL) structure over the substrate, the first MEOL structure having a bottom surface that physically contacts the substrate and that continually extends past a first outermost edge of the first source region along a second direction perpendicular to the first direction;
    forming a second MEOL structure over the second source region;
    forming a first gate structure between the first source region and the drain region, wherein the first gate structure extends past the first outermost edge of the first source region along the second direction;
    forming a second gate structure between the second source region and the drain region, wherein the first gate structure and the second gate structure are arranged along the first direction at a gate pitch;
    forming a power rail that is electrically coupled to the first MEOL structure and the second MEOL structure, the power rail comprising a first interconnect wire, a via rail disposed on and in contact with the first interconnect wire, and a second interconnect wire disposed on and in contact with the via rail, wherein the via rail continuously extends along the first direction past the first MEOL structure and the second MEOL structure; and
    wherein the via rail extends along the first direction for a length that is greater than the gate pitch, so as to reduce electro-migration stress on one or more of the first interconnect wire and the second interconnect wire.

2. The method of claim 1, wherein the first interconnect wire, the via rail, and the second interconnect wire extend in the first direction past opposing sides of both the first source region and the second source region.

3. The method of claim 1, wherein the second MEOL structure has a bottom surface that physically contacts the substrate and that continually extends past a second outermost edge of the second source region along a third direction opposing the second direction.

4. The method of claim 1,
    wherein the via rail has angled sidewalls that are oriented at a first angle with respect to a line that is normal to an upper surface of the substrate; and
    wherein the first interconnect wire has angled sidewalls that are oriented at a second angle with respect to the line that is normal to the upper surface of the substrate, the first angle is different than the second angle.

5. The method of claim 1, wherein the via rail laterally continually extends past a first plurality of conductive contacts directly contacting a lower surface of the first interconnect wire and past a second plurality of vias directly contacting an upper surface of the second interconnect wire.

6. The method of claim 1, further comprising:
forming a conductive via on and in contact with the first interconnect wire at a location laterally separated from the via rail, wherein the conductive via and the via rail have a same width and different lengths.

7. The method of claim 1, further comprising:
depositing an inter-metal dielectric (IMD) layer over the first interconnect wire;
selectively etching the IMD layer according to a first masking layer to form a via rail hole defined by first sidewalls of the IMD layer;
selectively etching the IMD layer according to a second masking layer to form an interconnect wire trench defined by second sidewalls of the IMD layer; and
performing a deposition process to fill the via rail hole and the interconnect wire trench with a conductive material.

8. The method of claim 1,
forming a first conductive contact directly contacting an upper surface of the first MEOL structure and a bottom surface of the first interconnect wire;
forming a second conductive contact directly contacting an upper surface of the second MEOL structure and the bottom surface of the first interconnect wire; and
wherein the via rail has a bottom surface directly contacting a top surface of the first interconnect wire and a top surface directly contacting a bottom surface of the second interconnect wire.

9. A method of forming an integrated chip, comprising:
forming a first source region and a second source region within a substrate, wherein the first source region is separated from the second source region by a drain region;
forming a first conductive contact electrically coupled to the first source region and a second conductive contact electrically coupled to the second source region, wherein the first conductive contact and the second conductive contact are formed within a first inter-metal dielectric (IMD) layer over the substrate;
forming a first interconnect wire within a second IMD layer over the first IMD layer, the first interconnect wire contacting the first conductive contact and the second conductive contact;
depositing a third IMD layer over the second IMD layer;
selectively etching the third IMD layer to form a via rail opening and an interconnect wire trench; and
filling the via rail opening and the interconnect wire trench with a conductive material to form a via rail on the first interconnect wire and a second interconnect wire on the via rail, wherein the via rail is defined by a lower surface continuously extending past the first source region and the second source region and the second interconnect wire is defined by a horizontally extending surface protruding laterally outward from an outermost sidewall of the via rail.

10. The method of claim 9, wherein the first interconnect wire has an upper surface that laterally extends past opposing outermost edges of the lower surface of the via rail.

11. The method of claim 10, further comprising:
forming a conductive via on and in contact with the first interconnect wire at a location laterally separated from the via rail, wherein the conductive via and the via rail both physically contact the upper surface of the first interconnect wire and wherein the conductive via and the via rail have a same width and different lengths.

12. The method of claim 9, further comprising:
forming a first MEOL structure physically contacting the first source region and a second MEOL structure physically contacting the second source region, wherein a bottom of the first MEOL structure continually extends from directly over the first source region to laterally outside of the first source region and a bottom of the second MEOL structure continually extends from directly over the second source region to laterally outside of the second source region;
forming the first conductive contact onto an upper surface of the first MEOL structure and the second conductive contact onto an upper surface of the second MEOL structure; and
wherein the first interconnect wire continuously extends past outermost sidewalls of the first MEOL structure and the second MEOL structure.

13. The method of claim 12, further comprising:
forming the first conductive contact onto the upper surface of the first MEOL structure at a first position laterally outside of the first source region; and
forming the second conductive contact onto the upper surface of the second MEOL structure at a second position laterally outside of the second source region.

14. A method of forming an integrated chip, comprising:
implanting a substrate to form source regions and drain regions on opposing sides of a plurality of gate structures over the substrate, wherein neighboring ones of the plurality of gate structures are arranged at a gate pitch;
forming a first interconnect wire coupled to the source regions by a plurality of conductive contacts;
forming a via rail to directly contact an upper surface of the first interconnect wire, wherein the upper surface of the first interconnect wire extends from directly below the via rail to laterally past an outermost edge of a lower surface of the via rail and wherein the via rail has a length that continuously extends over two or more of the plurality of conductive contacts;
forming a second interconnect wire onto the via rail; and
wherein the length of the via rail is greater than the gate pitch.

15. The method of claim 14, further comprising:
forming a first source region and a second source region within the substrate, the first source region separated from the second source region by a first drain region along a first direction;
forming a first MEOL structure over the first source region and a second MEOL structure over the second source region; and
forming a first one of the plurality of conductive contacts over the first MEOL structure and second one of the plurality of conductive contacts over the second MEOL structure.

16. The method of claim 15,
wherein the first MEOL structure has a first bottom surface that continually extends in a second direction, which is perpendicular to the first direction, from directly over the first source region to laterally outside of the first source region; and
wherein the second MEOL structure has a second bottom surface that continually extends in the second direction from directly over the second source region to laterally outside of the second source region.

17. The method of claim 14, further comprising:
forming a conductive via on the first interconnect wire at a location laterally separated from the via rail, wherein the conductive via and the via rail both physically contact the upper surface of the first interconnect wire and wherein the conductive via and the via rail have different lengths.

18. The method of claim 14, wherein forming the via rail comprises:
   depositing an dielectric material over the first interconnect wire;
   selectively etching the dielectric material to form a via rail hole within the dielectric material; and
   depositing a conductive material within the via rail hole to form the via rail.

19. The method of claim 14,
   wherein the via rail has an angled sidewall that is oriented at a first angle with respect to a line that is normal to an upper surface of the substrate; and
   wherein the first interconnect wire has an angled sidewall that is oriented at a second angle with respect to the line that is normal to the upper surface of the substrate, the first angle is different than the second angle.

20. The method of claim 14, wherein the via rail and the second interconnect wire are a same material.

* * * * *